United States Patent
Lee et al.

(10) Patent No.: US 11,852,969 B2
(45) Date of Patent: *Dec. 26, 2023

(54) CLEANING METHOD FOR PHOTO MASKS AND APPARATUS THEREFOR

(71) Applicant: TAIWAN SEMICONDUCTOR MANUFACTURING COMPANY, LTD., Hsinchu (TW)

(72) Inventors: Hsin-Chang Lee, Zhubei (TW); Pei-Cheng Hsu, Taipei (TW); Hao-Ping Cheng, Taichung (TW); Ta-Cheng Lien, Cyonglin Township (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 17/853,624

(22) Filed: Jun. 29, 2022

(65) Prior Publication Data
US 2022/0334468 A1 Oct. 20, 2022

Related U.S. Application Data

(63) Continuation of application No. 17/109,878, filed on Dec. 2, 2020, now Pat. No. 11,385,538.

(60) Provisional application No. 63/031,071, filed on May 28, 2020.

(51) Int. Cl.
*G03F 1/82* (2012.01)
*G03F 1/64* (2012.01)

(52) U.S. Cl.
CPC . *G03F 1/82* (2013.01); *G03F 1/64* (2013.01)

(58) Field of Classification Search
CPC ..................... G03F 1/64; G03F 1/82
USPC ............................................. 430/5
See application file for complete search history.

(56) References Cited

U.S. PATENT DOCUMENTS

| 9,348,218 | B2 | 5/2016 | Kobayashi |
| 11,209,736 | B2 | 12/2021 | Hsu et al. |
| 11,385,538 | B2 * | 7/2022 | Lee ........................ G03F 1/64 |
| 2015/0241797 | A1 | 8/2015 | Onivee et al. |
| 2020/0033740 | A1 | 1/2020 | Wu |

FOREIGN PATENT DOCUMENTS

| JP | 2006-184442 A | 7/2006 |
| JP | 2014-053425 A | 3/2014 |
| JP | 2014-115564 A | 6/2014 |
| JP | 2015-531890 A | 11/2015 |
| KR | 10-2016-0051745 A | 5/2016 |
| TW | I366065 B | 8/2007 |
| TW | 201039934 A | 11/2010 |
| TW | 201945840 A | 12/2019 |
| TW | 202006853 A | 2/2020 |
| TW | I686453 B | 3/2020 |
| WO | 2014/032887 A1 | 3/2014 |
| WO | 2015/033962 A1 | 3/2015 |

OTHER PUBLICATIONS

YouTube (https://www.youtube.com/watch?v=ML2zZY6RFBs), 00 LIN, May 16, 2017, 0:00-0:48.

Notice of Allowance issued in U.S. Appl. No. 17/109,878, dated Mar. 2, 2022.

\* cited by examiner

*Primary Examiner* — Christopher G Young
(74) *Attorney, Agent, or Firm* — Studebaker & Brackett PC

(57) ABSTRACT

In a method of cleaning a photo mask, the photo mask is placed on a support such that a pattered surface faces down, and an adhesive sheet is applied to edges of a backside surface of the photo mask.

20 Claims, 13 Drawing Sheets

CLEANING METHOD FOR PHOTO MASKS AND APPARATUS THEREFOR

RELATED APPLICATIONS

This application is a continuation of U.S. patent application Ser. No. 17/109,878 filed Dec. 2, 2020, now U.S. Pat. No. 11,385,538, which claims priority to U.S. Provisional Patent Application No. 63/031,071 filed on May 28, 2020, the entire contents of each of which are incorporated herein by reference.

BACKGROUND

A lithographic apparatus projects a pattern from a patterning device (e.g., a photo mask) onto a layer of radiation-sensitive material (resist) provided on the semiconductor substrate. When a photo mask is not used (stored) or transferred from a storage to an lithography apparatus, such as a stepper or a scanner, the photo mask is appropriately protected from contamination such as dust or particles by being placed in a mask case (pod).

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
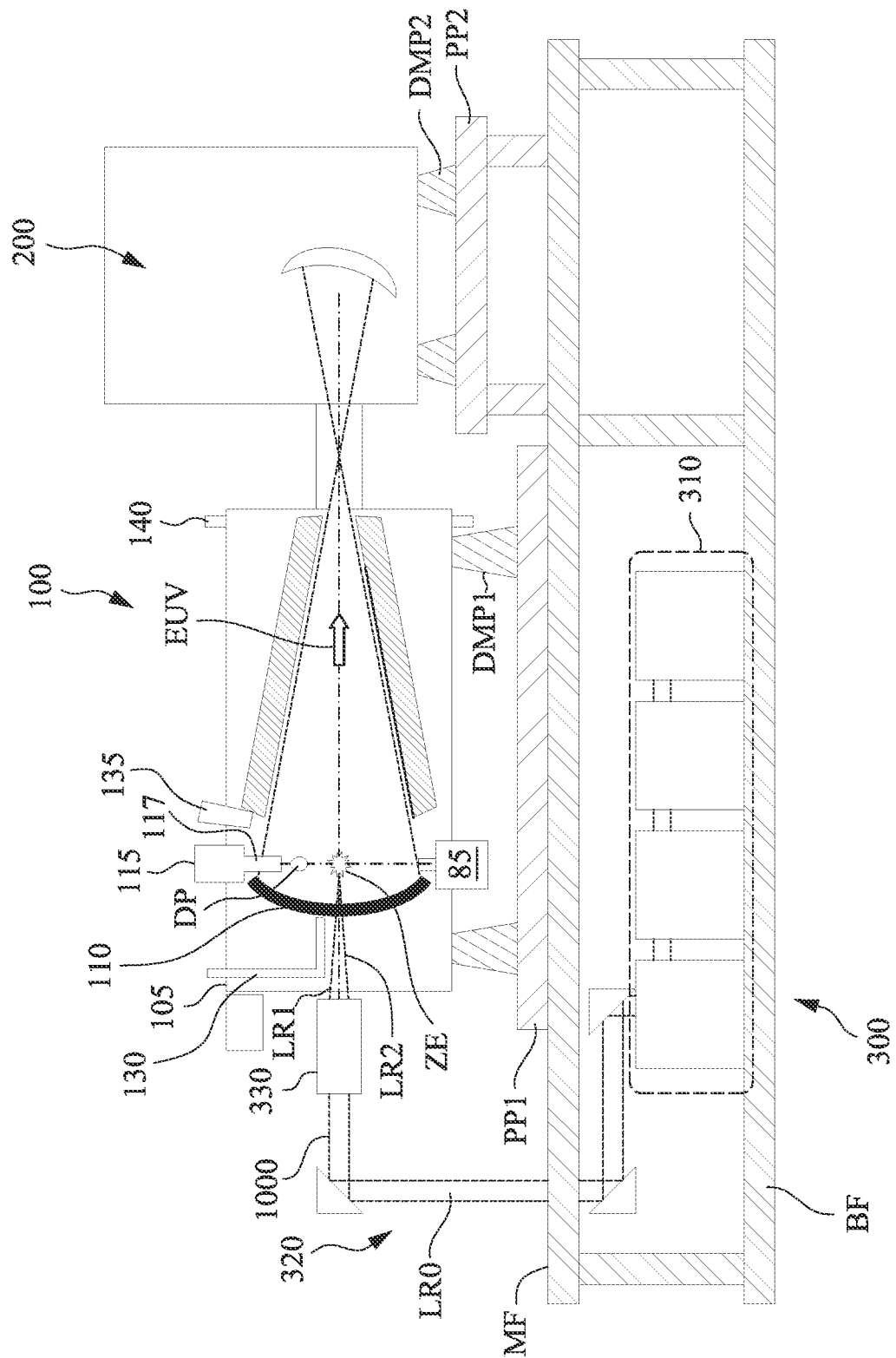
FIG. 1 is a schematic view of an extreme ultraviolet (EUV) lithography system with a laser produced plasma (LPP) EUV radiation source, constructed in accordance with some embodiments of the present disclosure.

It is to be understood that the following disclosure provides many different embodiments, or examples, for implementing different features of the invention. Specific embodiments or examples of components and arrangements are described below to simplify the present disclosure. These are, of course, merely examples and are not intended to be limiting. For example, dimensions of elements are not limited to the disclosed range or values, but may depend upon process conditions and/or desired properties of the device. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact. Various features may be arbitrarily drawn in different scales for simplicity and clarity. In the accompanying drawings, some layers/features may be omitted for simplification.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The device may be otherwise oriented (rotated 90 degrees or at other orientations) and the spatially relative descriptors used herein may likewise be interpreted accordingly. In addition, the term "made of" may mean either "comprising" or "consisting of." Further, in the following fabrication process, there may be one or more additional operations in between the described operations, and the order of operations may be changed. In the present disclosure, the phrase "at least one of A, B and C" means either one of A, B, C, A+B, A+C, B+C or A+B+C, and does not mean one from A, one from B and one from C, unless otherwise explained. Materials, configuration, dimensions and/or operations explained with one embodiment can be applied to other embodiments, and detailed explanation thereof may be omitted.

The present disclosure is generally related to extreme ultraviolet (EUV) lithography system and methods. Embodiments disclosed herein are directed to an improved method and apparatus for cleaning an extreme ultraviolet (EUV) photo mask.

The need for protection from particulate matter (i.e., dust, dirt, etc.) contaminating objects of interest is required in many fields of application, including applications in semiconductor manufacturing such as extreme ultraviolet lithography. A lithographic apparatus projects a pattern from a patterning device (e.g., a photo mask, or a reticle) onto a layer of radiation-sensitive material (resist) provided on the semiconductor substrate. The wavelength of radiation used by a lithographic apparatus to project a pattern onto a substrate determines the minimum size of features that can be formed on that substrate. A lithographic apparatus that uses extreme ultraviolet radiation, being electromagnetic radiation having a wavelength within the range 4-20 nm, may be used to form smaller features on a substrate than a related lithographic apparatus (which may for example use electromagnetic radiation with a wavelength of 193 nm).

The patterning device (photo mask or reticle) is protected from particle contamination by a pellicle. The pellicle is located away from the patterning device and is out of the focal plane of a lithographic apparatus in use. Because the pellicle is out of the focal plane of the lithographic apparatus, contamination particles which land on the pellicle are out of focus in the lithographic apparatus. Consequently, images of the contamination particles are not projected onto the substrate. If the pellicle were not present, then a contamination particle which landed on the patterning device would be projected onto the substrate and would introduce a defect into the projected pattern.

The photo mask with or without a pellicle is stored in a mask pod device and the mask pod device is stored in a photo mask library (stocker or storage) when not used, and transferred from the photo mask library to an EUV lithography apparatus (e.g., an EUV scanner). In the present disclosure, the terms mask, photomask, and reticle are used interchangeably. In addition, the term resist and photoresist are used interchangeably. In some embodiments, the mask is a reflective mask.

FIG. 1 shows a schematic view of an EUV lithography system with a laser produced plasma (LPP) EUV radiation source in accordance with some embodiments of the present disclosure. The EUV lithography system includes an EUV radiation source 100 (an EUV light source) to generate EUV radiation, an exposure device 200, such as a scanner, and an excitation laser source 300. As shown in FIG. 1, in some embodiments, the EUV radiation source 100 and the exposure device 200 are installed on a main floor MF of a clean room, while the excitation laser source 300 is installed in a base floor BF located under the main floor. Each of the EUV radiation source 100 and the exposure device 200 are placed over pedestal plates PP1 and PP2 via dampers DMP1 and DMP2, respectively. The EUV radiation source 100 and the exposure device 200 are coupled to each other by a coupling mechanism, which may include a focusing unit. In some embodiments, a lithography system includes the EUV radiation source 100 and the exposure device 200. In one particular example, the EUV radiation source 100 generates an EUV light with a wavelength centered at about 13.5 nm. In the present embodiment, the EUV radiation source 100 utilizes a mechanism of laser-produced plasma (LPP) to generate the EUV radiation.

The exposure device 200 includes various reflective optical components, such as convex/concave/flat mirrors, a mask holding mechanism including a mask stage, and wafer holding mechanism, e.g., a substrate holding mechanism. The EUV radiation generated by the EUV radiation source 100 is guided by the reflective optical components onto a mask secured on the mask stage. In some embodiments, the mask stage includes an electrostatic chuck (e-chuck) to secure the mask. Because gas molecules absorb EUV light, the lithography system for the EUV lithography patterning is maintained in a vacuum or a-low pressure environment to avoid EUV intensity loss. The exposure device 200 is described in more detail with respect to FIG. 2. In some embodiments, a reticle is transferred into the exposure device 200. As noted, the exposure device 200 is maintained under a vacuum environment and the reticle is mounted over a substrate, with a photo resist layer disposed on the substrate. The reticle has a pellicle mounted over the reticle. After transferring the reticle with the pellicle into the exposure device 200, the air pressure in the enclosure between the reticle and the pellicle is equalized with the vacuum environment of the exposure device 200 through the holes in the mounting fixture (the frame). The EUV radiation generated by the EUV radiation source 100 is directed by the optical components to project the mask on the photo resist layer of the substrate. In some embodiments, after the exposure of the mask on the photo resist layer of the substrate, the reticle with the pellicle is transferred out of the exposure device 200. After transferring the reticle with the pellicle out of the exposure device 200, the air pressure in the enclosure between the reticle and the pellicle is equalized with the atmospheric pressure outside the exposure device 200 through the holes in the mounting fixture.

The exposure device 200 includes a projection optics module for imaging the pattern of the mask on to a semiconductor substrate with a resist coated thereon secured on a substrate stage of the exposure device 200. The projection optics module generally includes reflective optics. The EUV radiation (EUV light) directed from the mask, carrying the image of the pattern defined on the mask, is collected by the projection optics module, thereby forming an image on the resist.

As shown in FIG. 1, the EUV radiation source 100 includes a droplet generator 115 and a LPP collector mirror 110, enclosed by a chamber 105. The droplet generator 115 generates a plurality of target droplets DP, which are supplied into the chamber 105 through a nozzle 117. In some embodiments, the target droplets DP are tin (Sn), lithium (Li), or an alloy of Sn and Li. In some embodiments, the target droplets DP each have a diameter in a range from about 10 microns (μm) to about 100 μm. For example, in an embodiment, the target droplets DP are tin droplets, each having a diameter of about 10 μm, about 25 μm, about 50 μm, or any diameter between these values. In some embodiments, the target droplets DP are supplied through the nozzle 117 at a rate in a range from about 50 droplets per second (i.e., an ejection-frequency of about 50 Hz) to about 50,000 droplets per second (i.e., an ejection-frequency of about 50 kHz). For example, in an embodiment, target droplets DP are supplied at an ejection-frequency of about 50 Hz, about 100 Hz, about 500 Hz, about 1 kHz, about 10 kHz, about 25 kHz, about 50 kHz, or any ejection-frequency between these frequencies. The target droplets DP are ejected through the nozzle 117 and into a zone of excitation ZE (e.g., a target droplet location) at a speed in a range from about 10 meters per second (m/s) to about 100 m/s in various embodiments. For example, in an embodiment, the target droplets DP have a speed of about 10 m/s, about 25 m/s, about 50 m/s, about 75 m/s, about 100 m/s, or at any speed between these speeds.

The excitation laser beam LR2 generated by the excitation laser source 300 is a pulsed beam. The laser pulses of laser beam LR2 are generated by the excitation laser source 300. The excitation laser source 300 may include a laser generator 310, laser guide optics 320 and a focusing apparatus 330. In some embodiments, the laser generator 310 includes a carbon dioxide ($CO_2$) or a neodymium-doped yttrium aluminum garnet (Nd:YAG) laser source with a wavelength in the infrared region of the electromagnetic spectrum. For example, the laser source 310 has a wavelength of 9.4 μm or 10.6 μm in an embodiment. The laser light beam LR0 generated by the excitation laser source 300 is guided by the laser guide optics 320 and focused, by the focusing apparatus 330, into the excitation laser beam LR2 that is introduced into the EUV radiation source 100. In some embodiments, in addition to $CO_2$ and Nd:YAG lasers, the laser beam LR2 is generated by a gas laser including an excimer gas discharge laser, helium-neon laser, nitrogen laser, transversely excited atmospheric (TEA) laser, argon ion laser, copper vapor laser, KrF laser or ArF laser; or a solid state laser including Nd:glass laser, ytterbium-doped glasses or ceramics laser, or ruby laser. In some embodiments, a non-ionizing laser beam LR1 is also generated by the excitation laser source 300 and the laser beam LR1 is also focused by the focusing apparatus 330.

In some embodiments, the excitation laser beam LR2 includes a pre-heat laser pulse and a main laser pulse. In such embodiments, the pre-heat laser pulse (interchangeably referred to herein as the "pre-pulse") is used to heat (or pre-heat) a given target droplet to create a low-density target plume with multiple smaller droplets, which is subsequently heated (or reheated) by a pulse from the main laser (main pulse), generating increased emission of EUV light compared to when the pre-heat laser pulse is not used.

In various embodiments, the pre-heat laser pulses have a spot size about 100 μm or less, and the main laser pulses have a spot size in a range of about 150 μm to about 300 μm. In some embodiments, the pre-heat laser and the main laser pulses have a pulse-duration in the range from about 10 ns to about 50 ns, and a pulse-frequency in the range from about 1 kHz to about 100 kHz. In various embodiments, the pre-heat laser and the main laser have an average power in the range from about 1 kilowatt (kW) to about 50 kW. The pulse-frequency of the excitation laser beam LR2 is matched with the ejection-frequency of the target droplets DP in an embodiment.

The laser beam LR2 is directed through windows (or lenses) into the zone of excitation ZE. The windows adopt a suitable material substantially transparent to the laser beams. The generation of the laser pulses is synchronized with the ejection of the target droplets DP through the nozzle 117. As the target droplets move through the excitation zone, the pre-pulses heat the target droplets and transform them into low-density target plumes. A delay between the pre-pulse and the main pulse is controlled to allow the target plume to form and to expand to an optimal size and geometry. In various embodiments, the pre-pulse and the main pulse have the same pulse-duration and peak power. When the main pulse heats the target plume, a high-temperature plasma is generated. The plasma emits EUV radiation, which is collected by the collector mirror 110. The collector mirror 110, an EUV collector mirror, further reflects and focuses the EUV radiation for the lithography exposing processes performed through the exposure device 200. A droplet DP that does not interact with the laser pulses is captured by the droplet catcher 85.

Figure 2:
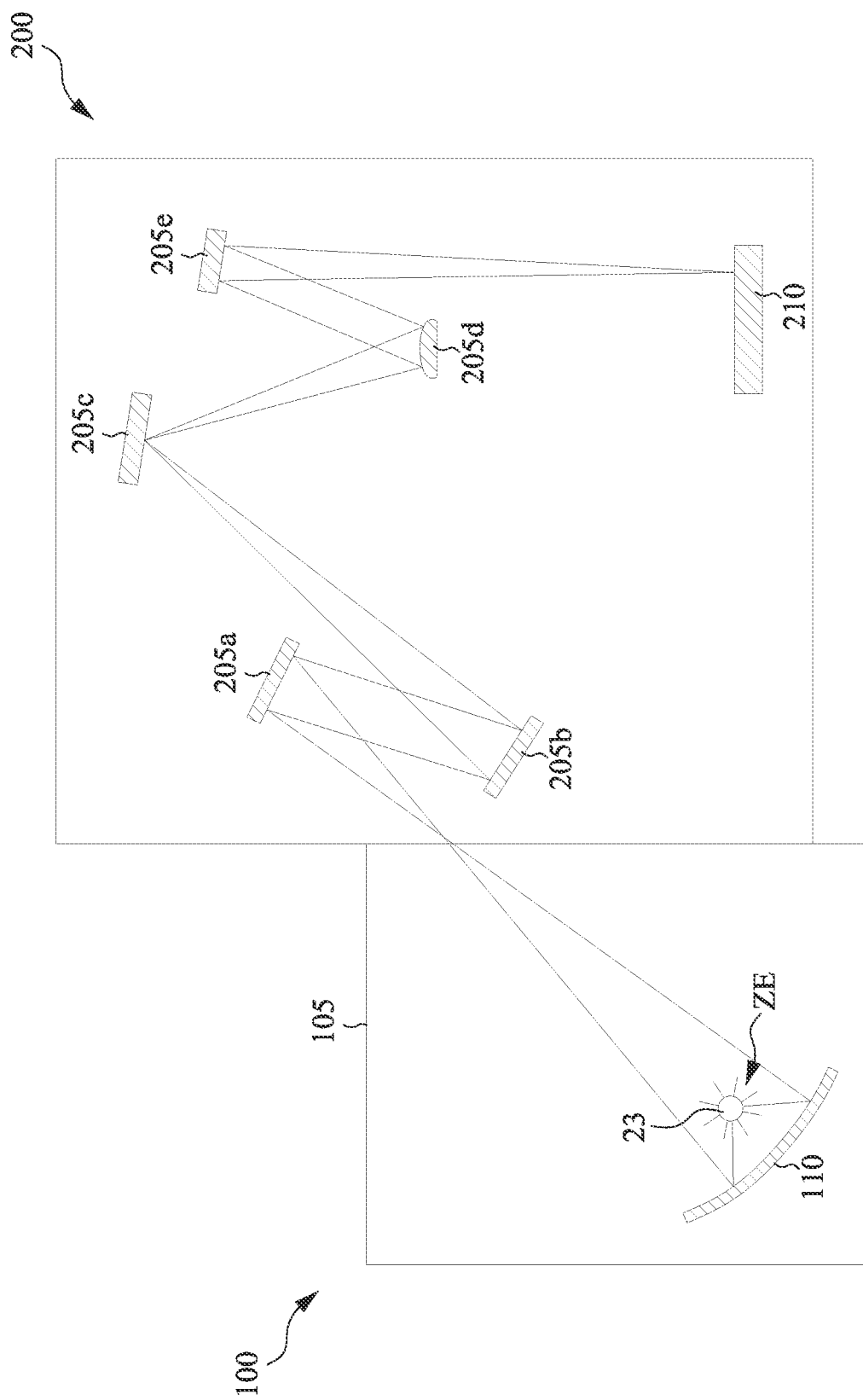
FIG. 2 is a schematic view of an EUV lithography system exposure tool according to embodiments of the disclosure.

FIG. 2 shows a schematic view of an EUV lithography (EUVL) exposure tool in accordance with some embodiments of the present disclosure. The EUVL exposure tool of FIG. 2 includes the exposure device 200 that shows the exposure of photoresist coated substrate, a target semiconductor substrate 210, with a patterned beam of EUV light. The exposure device 200 is an integrated circuit lithography tool such as a stepper, scanner, step and scan system, direct write system, device using a contact and/or proximity mask, etc., provided with one or more optics 205*a*, 205*b*, for example, to illuminate a patterning optic, such as a reticle, e.g., a reflective mask 205*c*, with a beam of EUV light, to produce a patterned beam, and one or more reduction projection optics 205*d*, 205*e*, for projecting the patterned beam onto the target semiconductor substrate 210. A mechanical assembly (not shown) may be provided for generating a controlled relative movement between the target semiconductor substrate 210 and patterning optic, e.g., a reflective mask 205*c*. As further shown, the EUVL exposure tool of FIG. 2, further includes the EUV radiation source 100 including a plasma plume 23 at the zone of excitation ZE emitting EUV light in the chamber 105 that is collected and reflected by a collector mirror 110 into the exposure device 200 to irradiate the target semiconductor substrate 210. In some embodiments, the mask pod device 10 is designed and manufactured according to the Standard Mechanical Interface (SMIF) standards, such as RSP200 pod.

Figure 3:
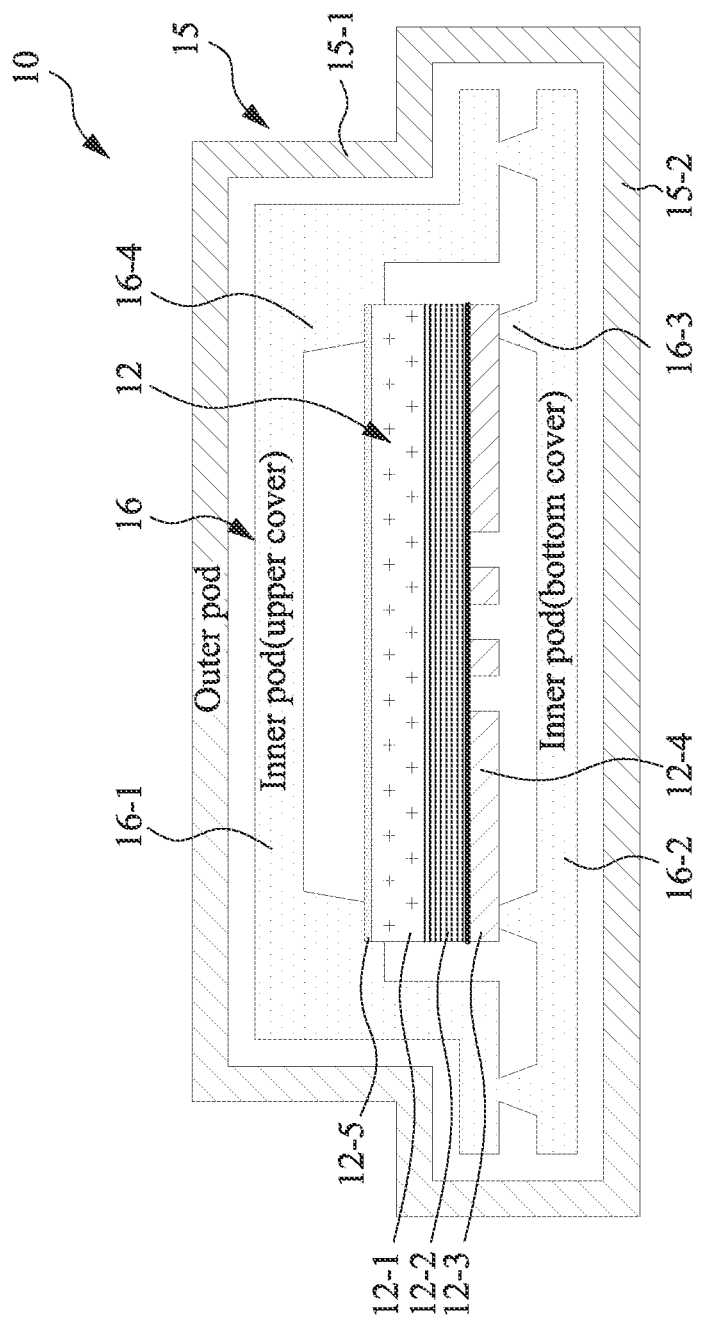
FIG. 3 is a schematic cross-sectional view of a mask pod device.

FIG. 3 shows a configuration of a mask pod device 10 in which an EUV photo mask 12 is stored. The EUV photo mask 12 includes a substrate 12-1, a multilayer Mo/Si stack 12-2 of multiple alternating layers of silicon and molybdenum, a capping layer 12-3, an absorber layer 12-4 and a backside conductive layer 12-5 formed on the backside of the substrate 12-1.

The substrate 12-1 is formed of a low thermal expansion material in some embodiments. In some embodiments, the substrate is a low thermal expansion glass or quartz, such as fused silica or fused quartz. In some embodiments, the low thermal expansion glass substrate transmits light at visible wavelengths, a portion of the infrared wavelengths near the visible spectrum (near infrared), and a portion of the ultraviolet wavelengths. In some embodiments, the low thermal expansion glass substrate absorbs extreme ultraviolet wavelengths and deep ultraviolet wavelengths near the extreme ultraviolet. In some embodiments, the size of the substrate 10 is 152 mm×152 mm (or 150 mm×150 mm) having a thickness of about 20 mm. The shape of the substrate 12-1 is square or rectangular.

In some embodiments, the Mo/Si multilayer stack 12-1 includes from about 30 alternating layers each of silicon and molybdenum to about 60 alternating layers each of silicon and molybdenum. In certain embodiments, from about 40 to about 50 alternating layers each of silicon and molybdenum are formed. In some embodiments, the reflectivity is higher than about 70% for wavelengths of interest e.g., 13.5 nm. Each layer of silicon and molybdenum is about 2 nm to about 10 nm thick. In some embodiments, the layers of silicon and molybdenum are about the same thickness. In other embodiments, the layers of silicon and molybdenum are different thicknesses. In some embodiments, the thickness of each silicon layer is about 4 nm and the thickness of each molybdenum layer is about 3 nm.

The capping layer 12-3 is disposed over the Mo/Si multilayer 12-2 to prevent oxidation of the multilayer stack 12-2 in some embodiments. In some embodiments, the capping layer 12-3 is made of ruthenium, a ruthenium alloy (e.g., RuNb, RuZr, RuZrN, RuRh, RuNbN, RuRhN, RuV or RuVN) or a ruthenium based oxide (e.g., $RuO_2$, RuNbO, RiVO or RuON), having a thickness of from about 2 nm to about 10 nm.

The absorber layer 12-4 is disposed over the capping layer 12-3 and circuit patterns are formed therein. In some embodiments, the absorber layer 25 is Ta-based material. In some embodiments, the absorber layer 12-4 is made of TaN, TaO, TaB, TaBO or TaBN having a thickness from about 25 nm to about 100 nm. In certain embodiments, the absorber layer 12-4 thickness ranges from about 50 nm to about 75 nm. In other embodiments, the absorber layer 12-4 includes a Cr based material, such as CrN, CrO and/or CrON. In some embodiments, the absorber layer 12-4 has a multilayered structure of Cr, CrO or CrON. In some embodiments, an antireflective layer (not shown) is optionally disposed over the absorber layer 12-4. The antireflective layer is made of a silicon oxide in some embodiments, and has a thickness of from about 2 nm to about 10 nm. In other embodiments, a TaBO layer having a thickness in a range from about 12 nm to about 18 nm is used as the antireflective layer. In some embodiments, the thickness of the antireflective layer is from about 3 nm to about 6 nm.

In some embodiments, the backside conductive layer 12-5 is made of TaB (tantalum boride) or other Ta based conductive material. In other embodiments, the backside conductive layer 45 is made of a Cr based conductive material (CrN or CrON). A thickness of the backside conductive layer 45 is in a range from about 50 nm to about 400 nm in some embodiments. In other embodiments, the backside conductive layer 45 has a thickness of about 50 nm to about 100 nm. In certain embodiments, the thickness is in a range from about 65 nm to about 75 nm.

The mask pod device 10 includes an outer pod 15 and an inner pod 16 enclosed by the outer pod 15. The outer pod 15 includes an upper case 15-1 and a bottom case 15-2, and the inner pod includes a upper cover 16-1 and a bottom cover 16-2. As shown in FIG. 3, the EUV photo mask 12 is placed in the inner pod face down (the absorber layer faces down to the bottom cover 16-2). For the sake of clarity of illustration, the pellicle is not shown installed over the patterned surface (absorber layer). However, it should be noted that a pellicle is installed over the photo mask 12.

Figure 4:
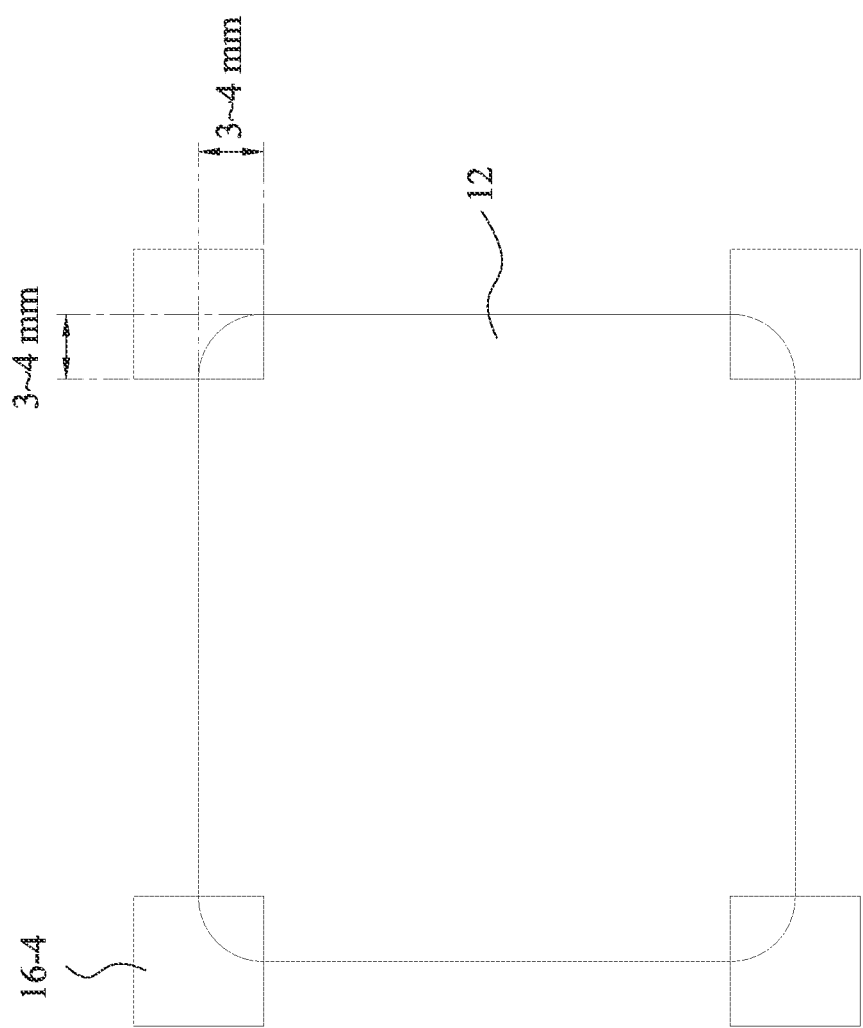
FIG. 4 shows a configuration of restraining supporters of the mask pod device.

The bottom cover 16-2 of the inner pod 16 includes one or more supports 16-3 to support the front surface of the photo mask 12, and the upper cover 16-1 of the inner pod 16 includes one or more restraining supporters 16-4 to support the backside of the photo mask 12. In some embodiments, as shown in FIG. 4, which is a view from the back surface of the photo mask, four restraining supporters 16-4 support the four corners of the photo mask 12.

Figure 5:
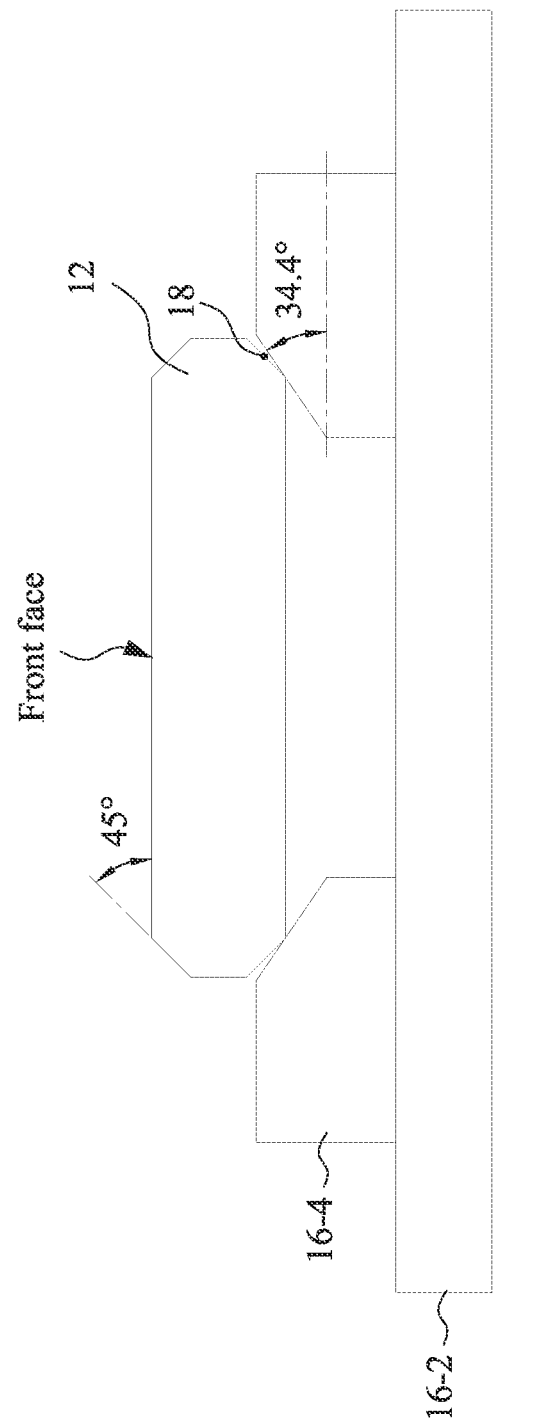
FIG. 5 shows a configuration when a photo mask is in contact with the restraining supporters.

FIG. 5 shows a cross sectional view when the upper cover 16-2 is closed and the restraining supporters 16-4 are in contact with the photo mask 12. It is noted that FIG. 5 is upside-down unlike FIG. 3.

An EUV photo mask 12 and the mask pod device have a specific shape and dimension. For example, the four corners are rounded with a radius of about 2 mm to about 3 mm, and the edge between the main surface and the side surface is chamfered by an amount of about 0.2 mm to about 0.6 mm, as shown in FIG. 5. The chamfered angle is about 45 degrees as shown in FIG. 5. In contrast, the restraining supporters 16-4 have an inclined surface on which the chamfered edge of the photo mask contacts, but has an angle of 34.4 degrees, as shown in FIG. 5. Because of the difference in the angles, the chamfered corner of the photo mask may damage or dig into the restraining supporter 16-4, creating a particle 18. Such a particle may affect the flatness of the photo mask 12 when mounted on a mask stage in an EUV lithography apparatus. To clean a photo mask, an air blower or a cleaning wiper has been used, but they may remove the particle only from the flat surface of the photo mask. Accordingly, it is necessary to effectively remove the particles from the edge or the backside of the photo mask 12.

Figure 6:
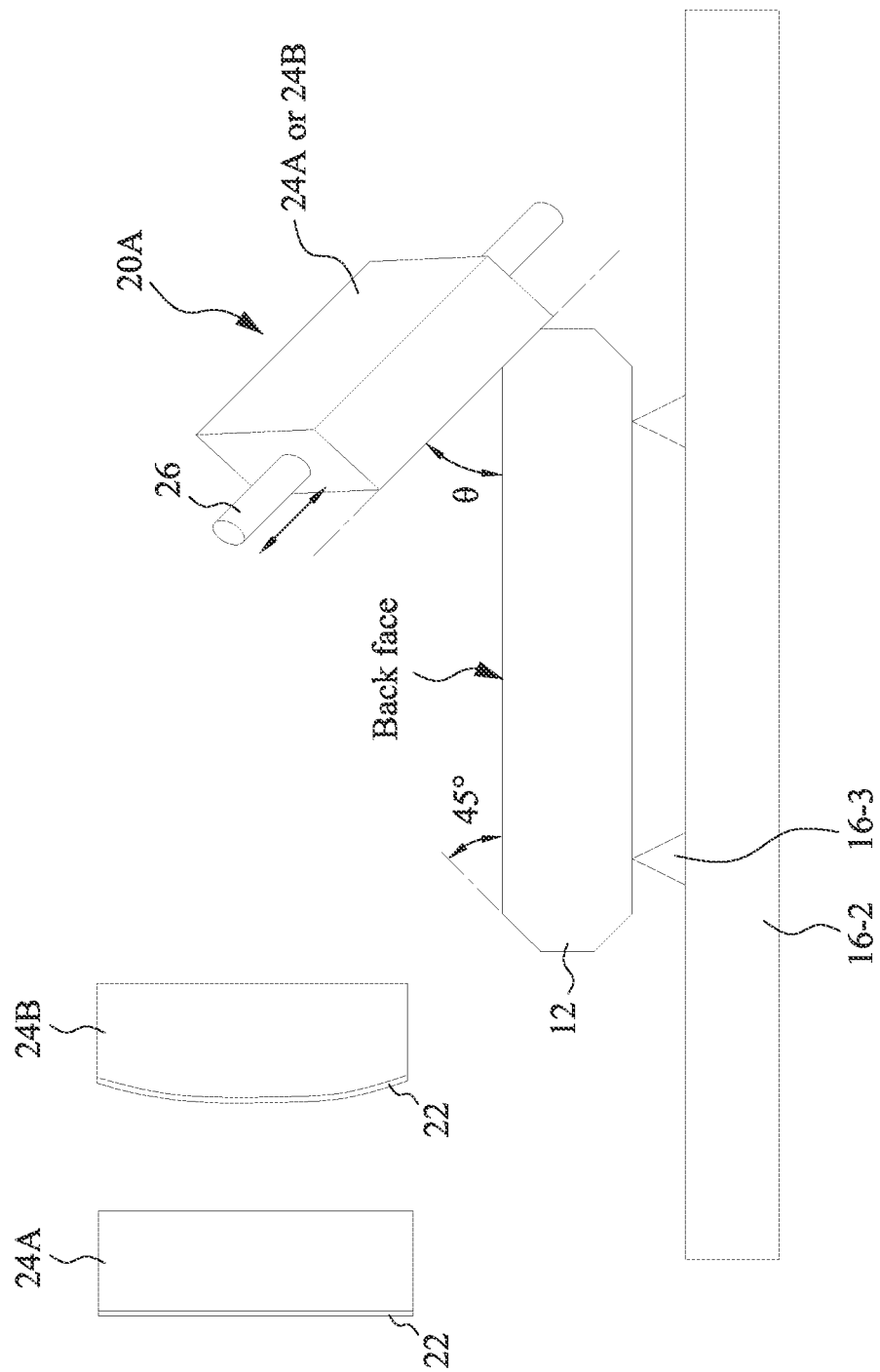
FIG. 6 shows a configuration of a cleaning device and cleaning operation according to an embodiment of the disclosure.

According to embodiments of the present disclosure, a cleaning device 20A as shown in FIG. 6 is used to remove the particle on the edge or the backside of the photo mask 12. In some embodiments, the cleaning device 20A includes an adhesive or sticky sheet or tape 22 attached to a body 24A or 24B as shown in FIG. 6. In some embodiments, the adhesive sheet 22 includes an elastomer or a gelatinous material. In some embodiments, the adhesive sheet 22 is made of silicone, a styrene-ethylene-butylene-styrene copolymer, a styrene-ethylene-propylene-styrene copolymer, or any other suitable adhesive material.

In some embodiments, the adhesive sheet 22 is disposed on at least one main surface of the body 24A or 24B. In some embodiments, the body 24A has a cuboid shape, and the adhesive sheet 22 is attached to a main flat surface of the body 24A. In other embodiments, the body 24B has at least one curved surface (convex or concave), on which the adhesive sheet 22 is attached. Further, in some embodiments, a handling grip 28 (see, FIG. 9) is attached to the body 24 through a rod 26. As shown in FIG. 6, the adhesive sheet 22 of the cleaning device 20A is applied to the chamfered edge of the backside of the photo mask 12 from the backside of the photo mask 12.

In some embodiments, the photo mask 12 is placed on the supports 16-3 of the bottom cover 16-2 by opening or removing the upper cover 16-1, and in other embodiments, the photo mask 12 is placed on another support table or stage. The particles on the edge of the photo mask 12 is removed by sliding the cleaning device 20 along and/or across the edges of the photo mask 12, as shown in FIG. 6. In some embodiments, the main surface of the adhesive sheet 22 is inclined with respect to the back surface of the photo mask 12 by an angle $\theta$ in a range from about 0 degrees to about 90 degrees. In other embodiments, the angle $\theta$ is in a range from about 30 degrees to about 75 degrees, and in certain embodiments, the angle $\theta$ is in a range from about 40 degrees to about 50 degrees. The cleaning device 20A is operated manually in some embodiments, and is operated mechanically in other embodiments. By adjusting the angle, the chamfered edge at the front face and the side face can be cleaned. In some embodiments, the chamfered edge at the back face is not treated by the cleaning device 20A.

In some embodiments, the thickness of the adhesive sheet 22 is in a range from about 1 mm to about 5 mm. In some embodiments, the adhesive sheet 22 is replaceable with a new adhesive sheet.

In some embodiments, the body 24A, 24B is made of an elastic material, such as rubber or sponge. The elastic material of the body 24A, 24B can apply appropriate pressure to the adhesive sheet 22 when applied to the photo mask 12, which improves particle removal efficiency. When the adhesive sheet 21 has a sufficient elasticity, the body 24A, 24B can be made of a non-elastic material, such as glass, plastic, ceramic or metal.

Figure 7:
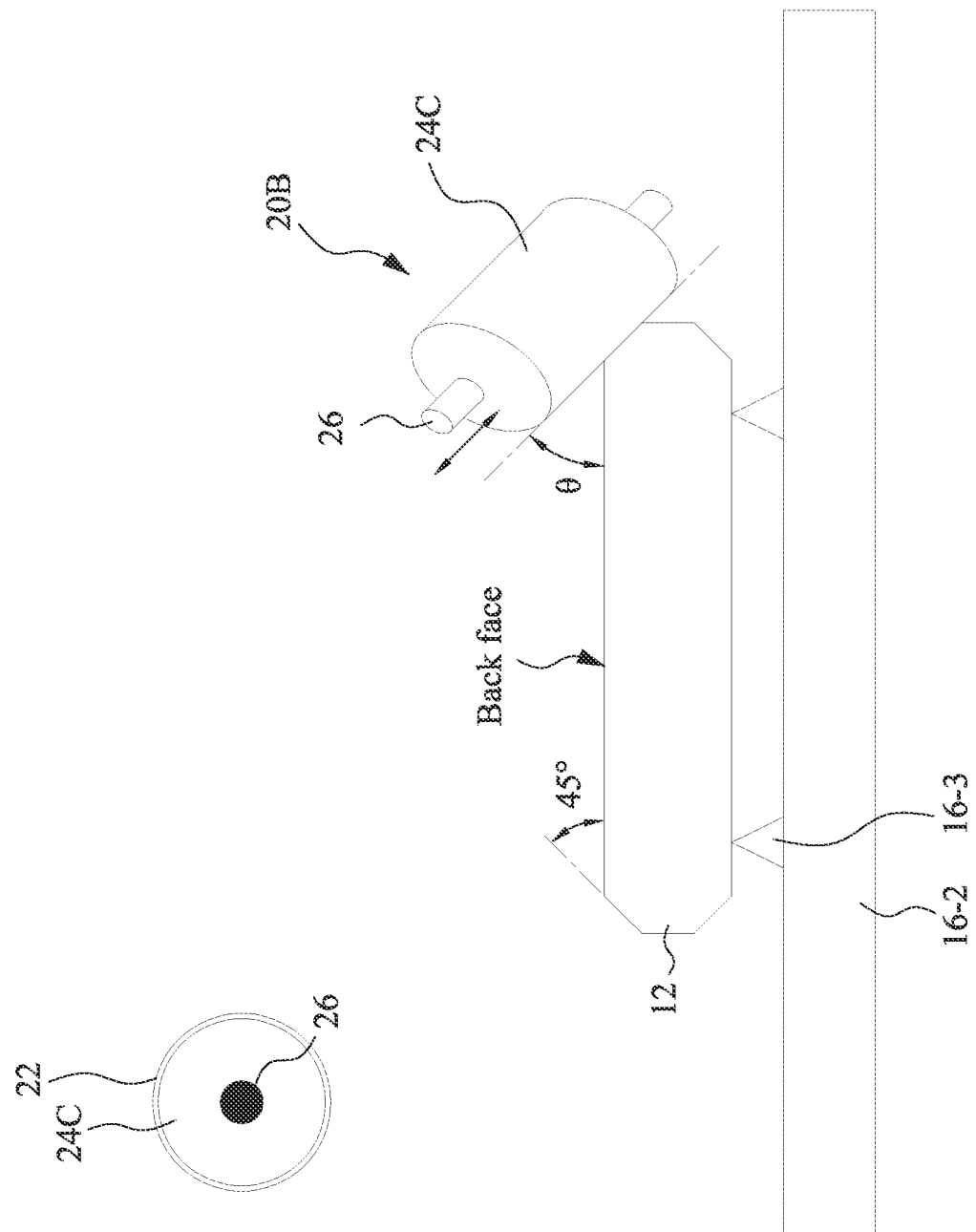
FIG. 7 shows a configuration of a cleaning device and cleaning operation according to an embodiment of the disclosure.

FIG. 7 shows a configuration of a cleaning device and cleaning operation according to an embodiment of the present disclosure. Materials, configuration, dimensions and/or operations explained with above embodiments can be applied to the following embodiments, and detailed explanation thereof may be omitted.

In some embodiments, a cleaning device 20B, as shown in FIG. 7, includes an adhesive or sticky sheet or tape 22 attached to a body 24C. In some embodiments, the adhesive sheet 22 includes an elastomer or a gelatinous material. In some embodiments, the adhesive sheet 22 is made of silicone, a styrene-ethylene-butylene-styrene copolymer, a styrene-ethylene-propylene-styrene copolymer, or any other suitable adhesive material. In some embodiments, the body 24C has a cylindrical shape around which the adhesive sheet 22 is wrapped. Further, in some embodiments, a handling grip 28 (see, FIG. 9) is attached to the body 24 through a rod 26.

As shown in FIG. 7, the adhesive sheet 22 of the cleaning device 20B is applied to the chamfered edge of the backside of the photo mask 12 from the backside of the photo mask 12. In some embodiments, the body 24C is linearly moved along the axis of the rod 26 manually or mechanically.

Figure 8:
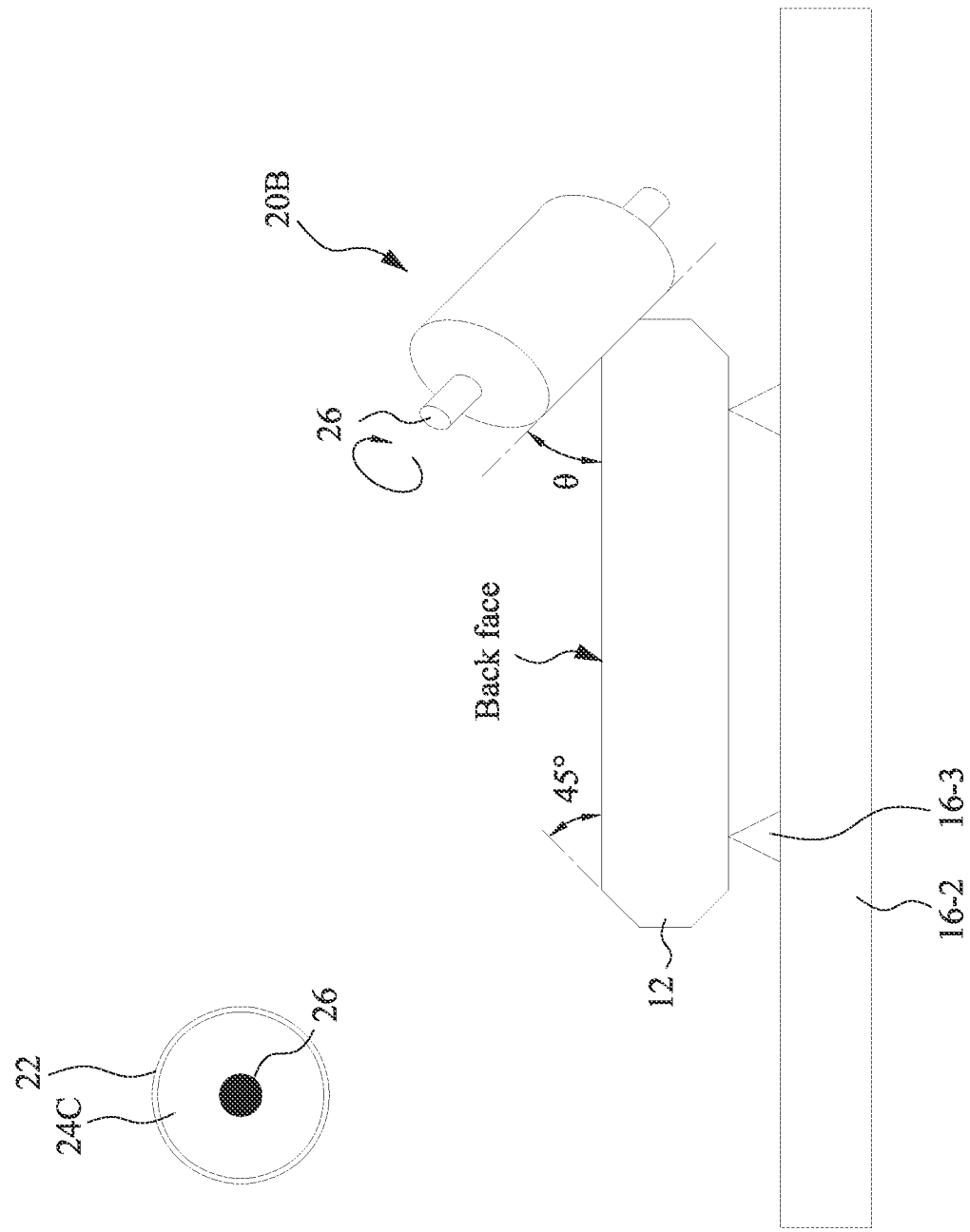
FIG. 8 shows a configuration of a cleaning device and cleaning operation according to an embodiment of the disclosure.

FIG. 8 shows a configuration of a cleaning device and cleaning operation according to an embodiment of the present disclosure. Materials, configuration, dimensions and/or operations explained with above embodiments can be applied to the following embodiments, and detailed explanation thereof may be omitted.

Figure 9:
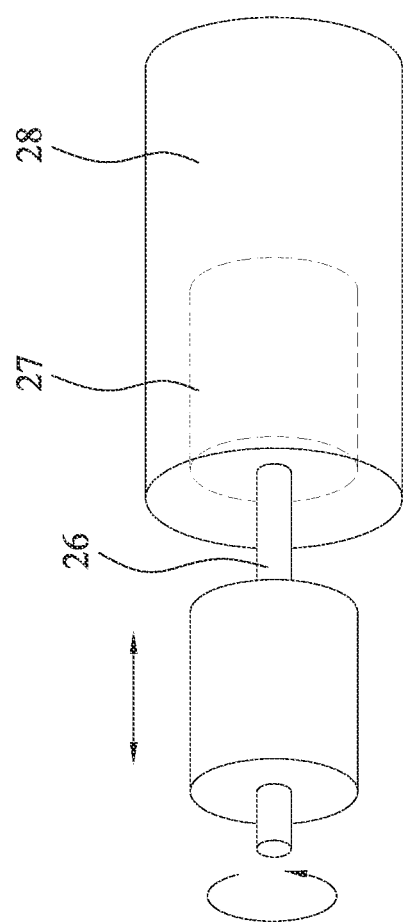
FIG. 9 shows a configuration of a cleaning device according to an embodiment of the disclosure.

In some embodiments, as shown in FIG. 8, the cleaning device 20C is rotational type, in which the body 24C with the adhesive sheet 22 rotates around the axis of the rod 26. In some embodiments, as shown in FIG. 9, the rod is rotated by a driving mechanism 27, such as a motor, disposed in the grip 28. In some embodiments, the driving mechanism 27 also moves the rod 26 linearly in a reciprocating manner as shown in FIG. 7. In some embodiments, the speed and directions of the movement of the rod 26 are adjustable. In some embodiments, the rod 26 is flexible and can be bent to fit the chamfered edges of the photo mask 12. In some embodiments, the driving mechanism 27 also applies vibrations to the body through the rod 26. The vibration is in an ultrasound range in some embodiments, and in other embodiments, the vibration is about 1 Hz to 10 kHz.

Figure 10:
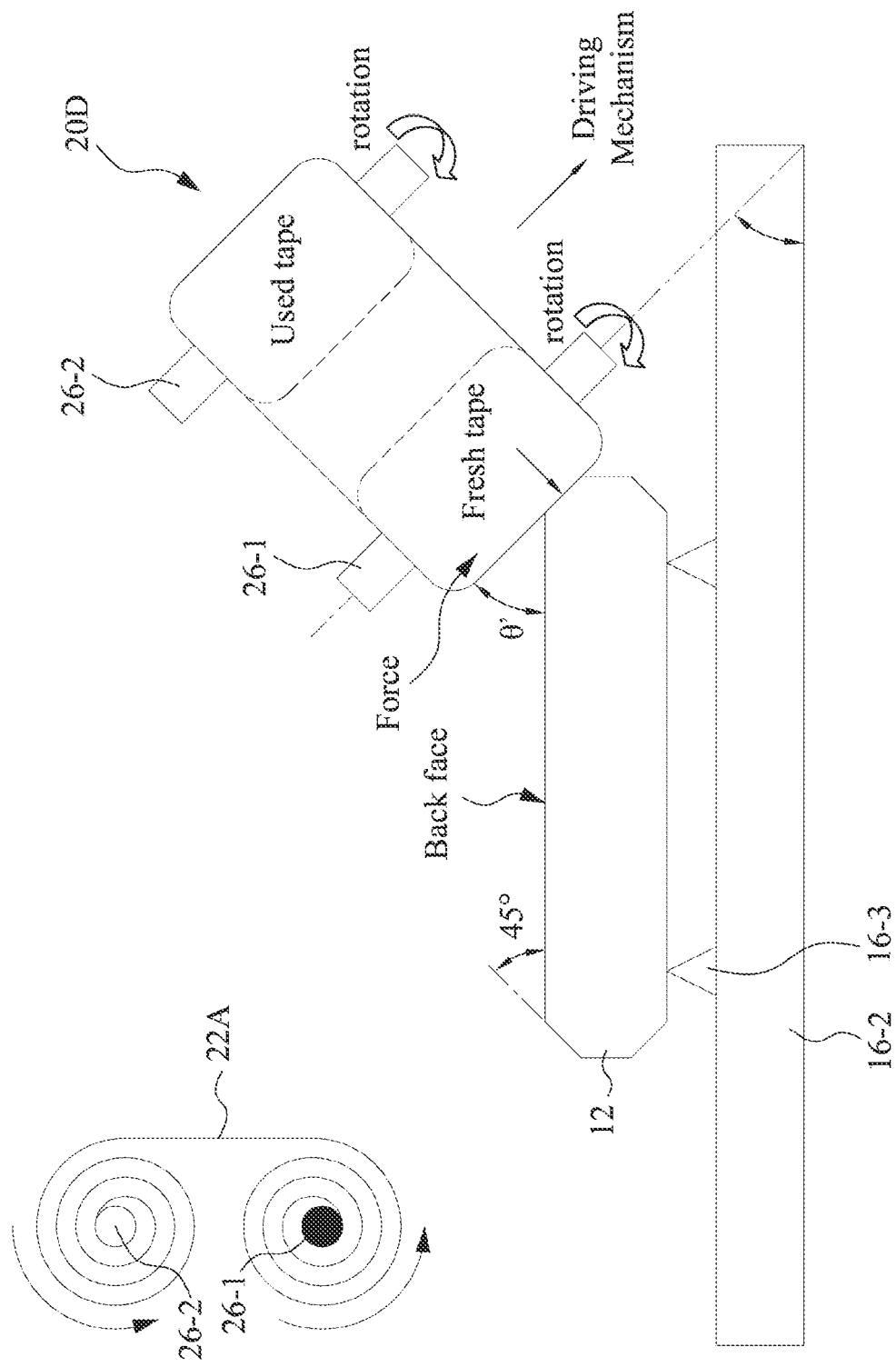
FIG. 10 shows a configuration of a cleaning device and cleaning operation according to an embodiment of the disclosure.

FIG. 10 shows a configuration of a cleaning device and cleaning operation according to an embodiment of the present disclosure. Materials, configuration, dimensions and/or operations explained with above embodiments can be applied to the following embodiments, and detailed explanation thereof may be omitted.

FIG. 10 shows a cleaning device according to another embodiment of the present disclosure. In some embodiments, in the cleaning device 20D shown in FIG. 10, an adhesive sheet or tape 22A is wound around a first rod or body 26-1 and one end of the adhesive sheet or tape 22A is attached to a second rod or body 26-2, such that by rotating the second rod or body 26-2, the adhesive sheet or tape 22A is released from the first rod or body 26-1 and wound around the second rod or body 26-2. The adhesive sheet or tape 22A is applied to the edge of the photo mask 12 to remove particles. The used part of the adhesive sheet or tape 22A is transferred to the second rod or body 26-2 and thus a new and fresh portion of the adhesive sheet or tape 22A can be applied to the next cleaning part of the photo mask 12.

In some embodiments, the rotation of the second rod or body 26-2 or the movement of the adhesive sheet or tape 22A is continuous. In other embodiments, the rotation of the second rod or body 26-2 or the movement of the adhesive sheet or tape 22A is a step-wise-manner. For example, after the one edge of the four sides of the photo mask 12 is cleaned, the adhesive sheet or tape 22A is refreshed by the rotational movement of the second rod or body 26-2. In other embodiments, the adhesive sheet or tape 22A is refreshed after a time interval.

In some embodiments, similar to FIG. 9, at least the second rod or body 26-2 is coupled to a driving mechanism 27, such as a motor, to control the rotational operation of the second rod or body 26-2. In other embodiments, the first rod or body 26-1 is also coupled to another motor or the same motor through one or more gears. In some embodiments, the rotational speed is adjustable. In some embodiments, the driving mechanism 27 also applies vibrations to the body through the rod 26. The vibration is in an ultrasound range in some embodiments, and in other embodiments, the vibration is about 1 Hz to 10 kHz.

In some embodiments, the main surface of the adhesive sheet or tape 22A is inclined with respect to the back surface of the photo mask 12 by an angle θ' in a range from about 0 degrees to about 90 degrees. In other embodiments, the angle θ' is in a range from about 30 degrees to about 75 degrees, and in certain embodiments, the angle θ' is in a range from about 40 degrees to about 50 degrees. By adjusting the angle, the chamfered edge at the front face and the side face can be cleaned. In some embodiments, the chamfered edge at the back face is not treated by the cleaning device 20D.

Figure 11:
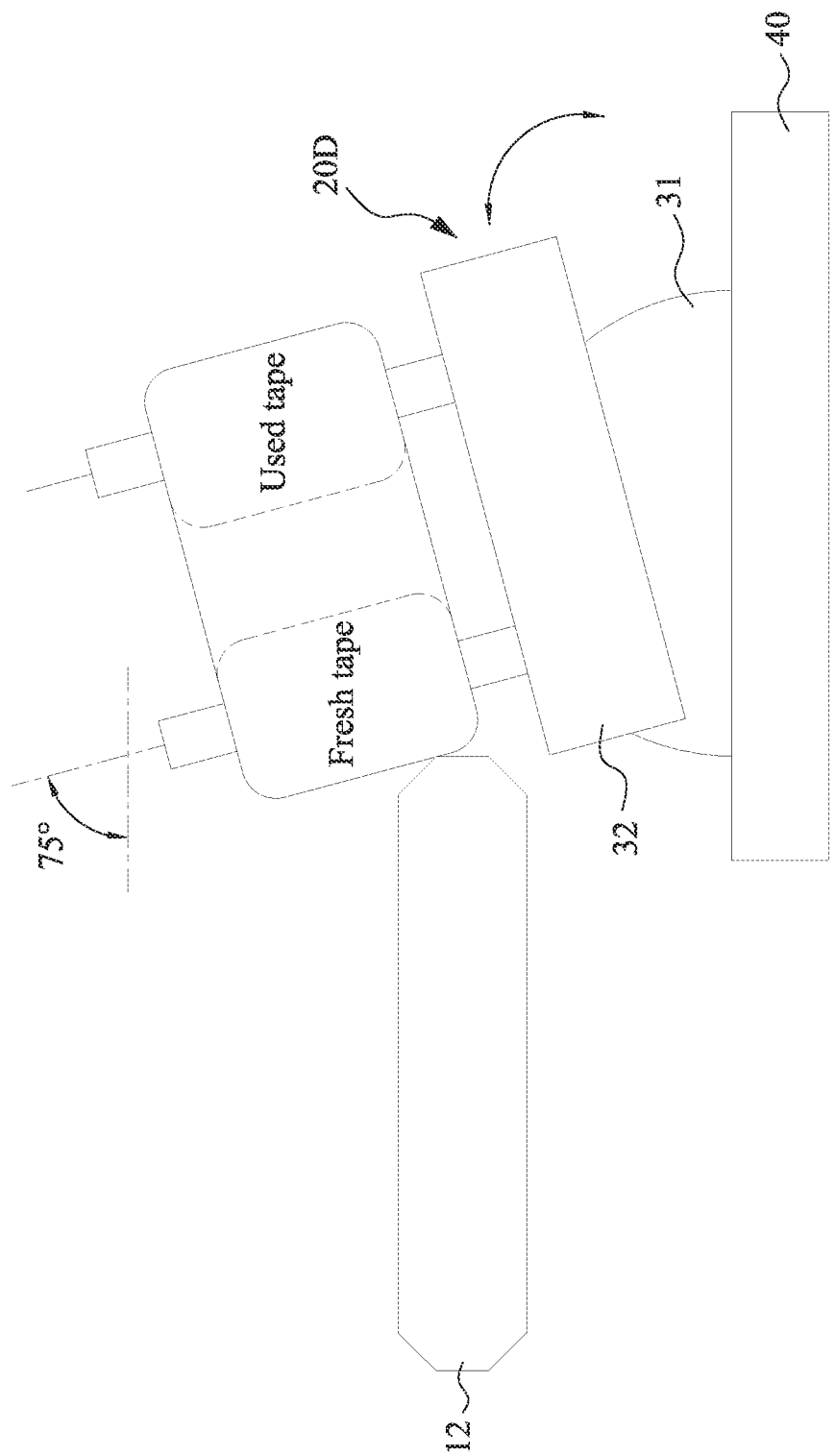
FIG. 11 shows a configuration of a cleaning device and cleaning operation according to an embodiment of the disclosure.

In some embodiments, the angle θ' shown in FIG. 10 and the angle θ shown in FIGS. 6-8 can be adjusted or changed by a mounting jig 30 as shown in FIG. 11. In some embodiments, the mounting jig 30 includes a base plate having arc portion, which can be an outer periphery of the base plate or an arch shaped slit formed in the base plate, and a movable plate 32 that moves along the arc portion. The movable portion 32 is coupled to the cleaning device 20 or 20A, and by moving the movable plate 32 along the arc portion, the angle θ' or θ, can be changed.

In some embodiments, the mounting jig 30 includes one or more motors, gears or any other mechanism to change the angle θ' or θ. Further, the mounting jig 30 is also configured to change the position of the entire cleaning device (adhesive sheet) with respect to the photo mask 12.

In some embodiments, the mounting jig 30 is attached or attachable to a pod mounting device 40. As shown in FIG. 3, an EUV photo mask is mounted on the inner pod 16 and the inner pod 16 is mounted on the outer pod 15, and the inner pod is dismounted from the outer pod and the photo mask is dismounted form the inner pod. In some embodiments, these mounting and dismounting operations are performed by a pod mounting device 40. In some embodiments, the mounting and dismounting operations of the photo mask on and from the inner pod 16 is performed by a different pod mounting device from the pod mounting device for mounting and dismounting operations of the inner pod 16 on and from the outer pod 15.

In some embodiments, after the upper cover 16-4 is removed from the inner pod to expose the back side of the photo mask 12, the cleaning device is applied to the chamfered edge of the back side of the photo mask 12. When the mounting jig 30 is attached to the pod mounting device 40, it is efficient to clean the chamfered edge of the photo mask 12. In some embodiments, the cleaning is mechanically and automatically performed by using one or more control circuit programmed to control the mounting jig 30 and the cleaning device 20 and 20A.

In other embodiments, the mounting jig 30 is attached or attachable to another independent stage used for the purpose of cleaning.

Figure 12:
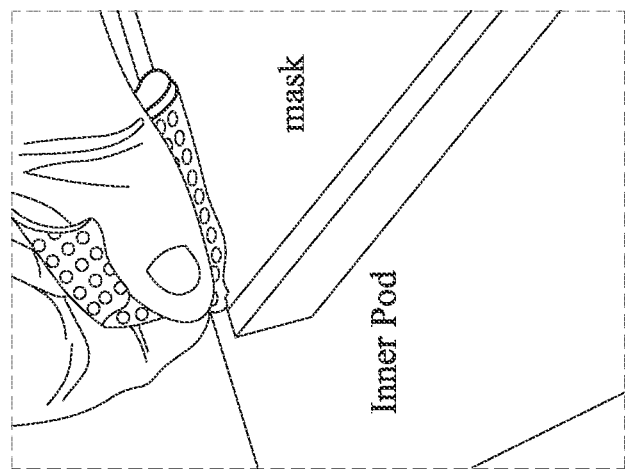
FIG. 12 shows a manual operation of a cleaning operation according to an embodiment of the disclosure.
Figure 12:
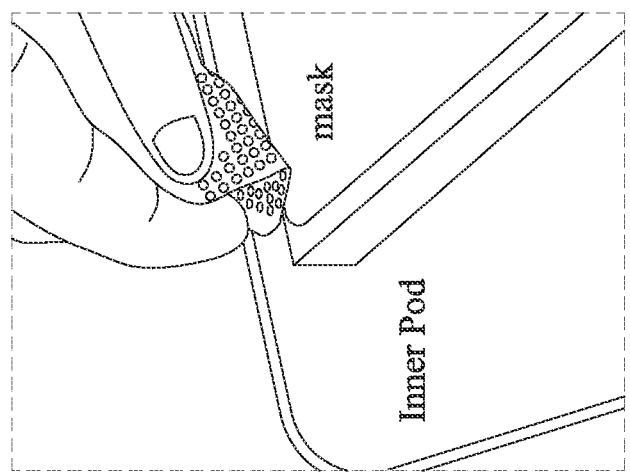
Figure 12:
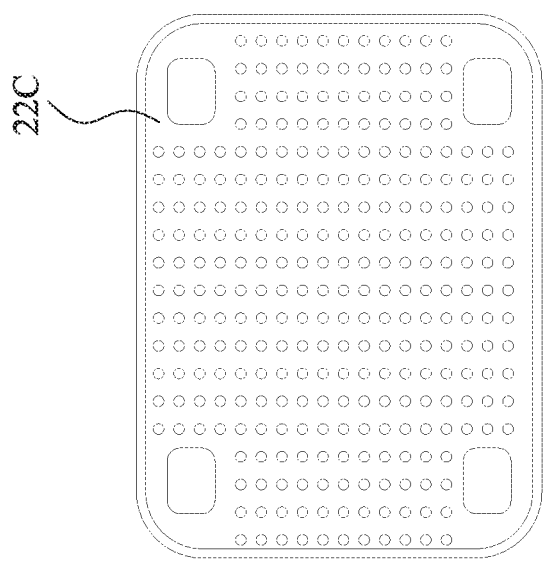

In some embodiments, as shown in FIG. 12, an adhesive sheet 22B is manually applied to the chamfered edge of the back side of the photo mask 12.

In some embodiments, the cleaning device includes a body 28 and a flexible support having a frame shape and an inclined surface, and an adhesive sheet or tape is attached on the inclined surface (applicator surface). The inclined surface has an inclined angle θ, which is about 40 degrees to 50 degrees, in some embodiments, and the angle θ is 45 degrees in a certain embodiment. In some embodiments, the flexible support has a larger or smaller flexibility than the adhesive sheet. In some embodiments, the flexible support includes rubber, sponge, polymer, or other suitable material. In some embodiments, the thickness of the adhesive sheet is in a range from about 0.5 mm to about 5 mm, and is in a range from about 1 mm to about 3 mm.

In use, the cleaning device is applied to the backside of photo mask 12 from above so that the adhesive sheet contact the chamfered edges of the photo mask 12. The cleaning device is pressed to the photo mask 12 such that the flexible support deforms. By repeating the pressing and detaching of the cleaning device, the edge of the photo mask 12 is cleaned. In some embodiments, the cleaning device 12 is rotated by 90 or 180 degrees after detaching from the photo mask 12. Vibration as set forth above may be applied during the pressing the cleaning device to the photo mask. In some embodiments, the flexible body is made of the materials for the adhesive tape and is made of silicone, a styrene-ethylene-butylene-styrene copolymer, a styrene-ethylene-propylene-styrene copolymer, or any other suitable adhesive material. In such a case, the adhesive tape is not necessary. In some embodiments, the cleaning device is applied to the photo mask 12 by an automated mechanical structure.

Figure 13B:
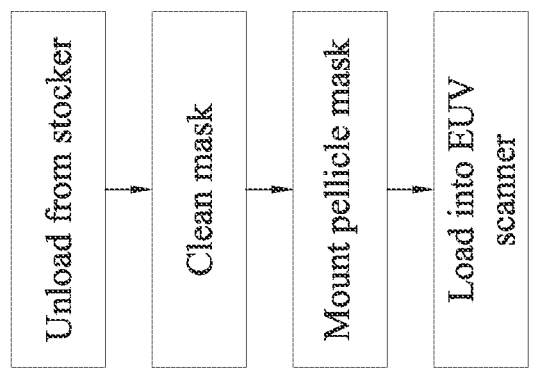
FIGS. 13A and 13B show process flows of cleaning an EUV photo mask according to embodiments of the present disclosure.
Figure 13A:
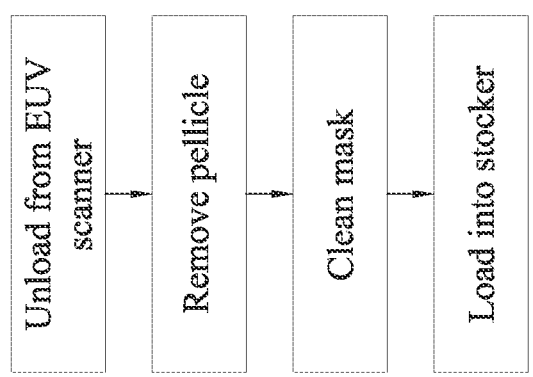

FIGS. 13A and 13B show a process flow of cleaning an EUV photo mask according to embodiments of the present disclosure.

In FIG. 13A, after the EUV photo mask is used in an EUV lithography apparatus, the EUV photo mask is unloaded from the EUV lithography apparatus. In some embodiments, the EUV photo mask is loaded into an inner pod in a vacuum state. Then, the inner pod is unloaded from the vacuum apparatus and is loaded into an outer pod of the mask pod device. Then, the mask pod device is loaded on a pod dismounting device and the outer pod and inner pod are removed. In some embodiments, the pellicle is removed before the photo mask is loaded into the inner pod. Then, the photo mask is subjected to a cleaning operation in some embodiments. In some embodiments, the cleaning operation includes cleaning the entire photo mask by a wet and/or dry cleaning. In some embodiments, the cleaning operation includes the cleaning the chamfered edges of the backside of the photo mask as explained above. After the cleaning operation, the photo mask is loaded into a mask library or a mask stocker.

In FIG. 13B, when an EUV photo mask is used, the photo mask is unloaded from the mask library or stocker and then subjected to the cleaning operation. In some embodiments, the cleaning operation includes cleaning the entire photo mask by a wet and/or dry cleaning. In some embodiments, the cleaning operation includes cleaning the chamfered edges of the backside of the photo mask as explained above. After the cleaning operation, if a pellicle was not mounted over the photo mask, a pellicle is mounted over the photo mask. Then, the photo mask is loaded into an inner pod and the inner pod is loaded into an outer pod, and the mask pod device is transferred to an EUV lithography apparatus. The inner pod is removed from the outer pod in a vacuum state, and the inner pod is transferred to the lithography apparatus. In the EUV lithography apparatus, the photo mask is unloaded from the inner pod under vacuum, and set on a mask stage of the EUV lithography apparatus.

According to embodiments, of the present disclosure, an adhesive sheet or tape can effectively remove particles on chamfered edges of the backside of an EUV photo mask. Since the adhesive sheet or tape is relatively low cost, the cleaning cost can be suppressed. Although cleaning methods for an EUV photo mask are explained, the cleaning method of the present disclosure can apply to cleaning of any type of photo mask, e.g., photo masks for deep UV lithography or UV lithography, or a photo mask without chamfered edges.

It will be understood that not all advantages have been necessarily discussed herein, no particular advantage is required for all embodiments or examples, and other embodiments or examples may offer different advantages.

According to some embodiments of the present disclosure, in a method of cleaning a photo mask, the photo mask is placed on a support such that a pattered surface faces down, and an adhesive sheet is applied to edges of a backside surface of the photo mask. In one or more of the foregoing or following embodiments, the edges of the backside surface of the photo mask are chamfered edges. In one or more of the foregoing or following embodiments, the adhesive sheet is made of silicone. In one or more of the foregoing or following embodiments, the adhesive sheet is made of a styrene-ethylene-butylene-styrene copolymer or a styrene-ethylene-propylene-styrene copolymer. In one or more of the foregoing or following embodiments, the adhesive sheet is attached to a body. In one or more of the foregoing or following embodiments, the body is made of an elastic material. In one or more of the foregoing or following embodiments, the applying the adhesive sheet comprises moving the body while the adhesive sheet is in contact with the edges. In one or more of the foregoing or following embodiments, the moving comprises a linear movement.

In accordance with another aspect of the present disclosure, in a method of cleaning a photo mask, the photo mask is loaded into an inner pod, the inner pod is loaded into an outer pod, the outer pod is opened, an inner pod is opened such that the photo mask is placed over a bottom cover of the inner pod with a patterned surface facing down, and an adhesive sheet is applied to edges of a backside surface of the photo mask, while the photo mask placed over bottom cover of the inner pod. In one or more of the foregoing or following embodiments, an adhesive sheet is attached to a surface of a body, and a body is coupled to a grip by a rod, and in the applying the adhesive sheet, the grip is operated to clean the edges of the backside surface of the photo mask. In one or more of the foregoing or following embodiments, the body has a cylindrical shape and the adhesive sheet wraps around the body. In one or more of the foregoing or following embodiments, the applying the adhesive sheet comprises rotating the body. In one or more of the foregoing or following embodiments, the body has a curved surface and the adhesive sheet is attached to the curved surface. In one or more of the foregoing or following embodiments, the applying the adhesive sheet comprises applying vibration to the body. In one or more of the foregoing or following embodiments, the vibration is in an ultrasound range. In one or more of the foregoing or following embodiments, edges of a patterned surface is not cleaned by the adhesive sheet.

In accordance with another aspect of the present disclosure, a cleaning device for removing a particle from an edge of a backside of an EUV photo mask, includes a first body around which an adhesive tape is wound, a second body to which an end of the adhesive tape is attached, and a driving mechanism to rotate the second body. The adhesive tape is made of one of silicone, a styrene-ethylene-butylene-styrene copolymer or a styrene-ethylene-propylene-styrene copolymer. In one or more of the foregoing or following embodiments, the cleaning device further includes a mounting jig configured to change an angle between a surface of the adhesive tape and the backside of the photo mask. In one or more of the foregoing or following embodiments, the mounting jig is attached to a mask pod mounting-dismounting device. In one or more of the foregoing or following embodiments, the driving mechanism is configured to adjust a rotational speed of the second body.

The foregoing outlines features of several embodiments or examples so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments or examples introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of cleaning a photo mask, comprising:
   placing the photo mask on a support; and
   applying an adhesive sheet to edges of the photo mask.

2. The method of claim 1, wherein the edges of the photo mask are chamfered edges.

3. The method of claim 1, wherein the adhesive sheet is made of silicone.

4. The method of claim 1, wherein the adhesive sheet is made of a styrene-ethylene-butylene-styrene copolymer or a styrene-ethylene-propylene-styrene copolymer.

5. The method of claim 1, wherein the adhesive sheet is attached to a body.

6. The method of claim 5, wherein the body is made of an elastic material.

7. The method of claim 5, wherein the applying the adhesive sheet comprises moving the body while the adhesive sheet is in contact with the edges.

8. The method of claim 7, wherein the moving comprises a linear movement.

9. A method of cleaning a photo mask, comprising:
   opening an outer pod in which an inner pod is disposed, the photo mask being disposed in the inner pod;
   opening the inner pod such that the photo mask is placed over a bottom cover of the inner pod with a patterned surface of the photo mask facing down; and
   applying an adhesive sheet to edges of a backside surface of the photo mask.

10. The method of claim 9, wherein:
    the adhesive sheet is attached to a surface of a body, and
    the body is coupled to a grip by a rod, and
    applying the adhesive sheet comprises operating the grip to clean the edges of the backside surface of the photo mask.

11. The method of claim 10, wherein the body has a cylindrical shape and the adhesive sheet wraps around the body.

12. The method of claim 11, wherein the applying the adhesive sheet comprises rotating the body.

13. The method of claim 10, wherein the body has a curved surface and the adhesive sheet is attached to the curved surface.

14. The method of claim 10, wherein the applying the adhesive sheet comprises applying vibration to the body.

15. The method of claim 14, wherein the vibration is in an ultrasound range.

16. The method of claim 9, wherein edges of the patterned surface of the photo mask are not cleaned by the adhesive sheet.

17. A cleaning device for cleaning an EUV photo mask, the cleaning device comprising:
    a body coupled to a grip by a rod; and
    an adhesive sheet attached to a surface of the body,
    wherein the adhesive sheet is made of one of silicone, a styrene-ethylene-butylene-styrene copolymer or a styrene-ethylene-propylene-styrene copolymer.

18. The cleaning device of claim 17, further comprising a driving mechanism coupled to the rod to rotate the rod.

19. The cleaning device of claim 18, wherein the driving mechanism is configured to adjust a rotational speed of the rod.

20. The cleaning device of claim 17, further comprising a driving mechanism coupled to the rod to apply vibration to the rod.

* * * * *